United States Patent [19]

Tanksalvala et al.

[11] Patent Number: 5,030,904
[45] Date of Patent: Jul. 9, 1991

[54] DIAGNOSTIC SYSTEM FOR INTEGRATED CIRCUITS USING EXISTING PADS

[75] Inventors: Darius F. Tanksalvala, Denver; Douglas A. Quarnstrom, Fort Collins, both of Colo.

[73] Assignee: Hewlett-Packard Company, Palo Alto, Calif.

[21] Appl. No.: 480,191

[22] Filed: Feb. 13, 1990

[51] Int. Cl.$^5$ .............................................. G01R 31/28
[52] U.S. Cl. ................................ 324/158 R; 324/73.1; 371/22.5
[58] Field of Search ............... 324/158 R, 158 T, 73.1; 371/22.1, 22.4, 22.5

[56] References Cited

U.S. PATENT DOCUMENTS

| | | | |
|---|---|---|---|
| 4,336,495 | 6/1982 | Hapke | 324/158 R |
| 4,398,146 | 8/1983 | Draheim et al. | 324/158 T |
| 4,635,261 | 1/1987 | Anderson et al. | 371/22.4 |
| 4,714,876 | 12/1987 | Gay et al. | 324/158 R |
| 4,724,380 | 2/1988 | Burrows et al. | 324/158 R |
| 4,743,841 | 5/1988 | Takeuchi | 324/158 R |

Primary Examiner—Ernest F. Karlsen

[57] ABSTRACT

Circuit points in an integrated circuit (IC) are monitored at pads normally used to carry information between ports of a normal source on the IC (such as input/output points of a cache control), and a memory unit off the IC. The pads are time-shared between their normal and monitoring functions. Each pad is shared by a port of the normal source (the cache control) and a pair of alternative sources to be monitored. During times when the alternative sources are accessed through a pad, they are connected to it alternately, so that, on a first level, each pad is shared between a normal source and a pair of alternative sources, and, on a second level, each such pad is shared between the two alternative sources when they are being accessed.

10 Claims, 4 Drawing Sheets

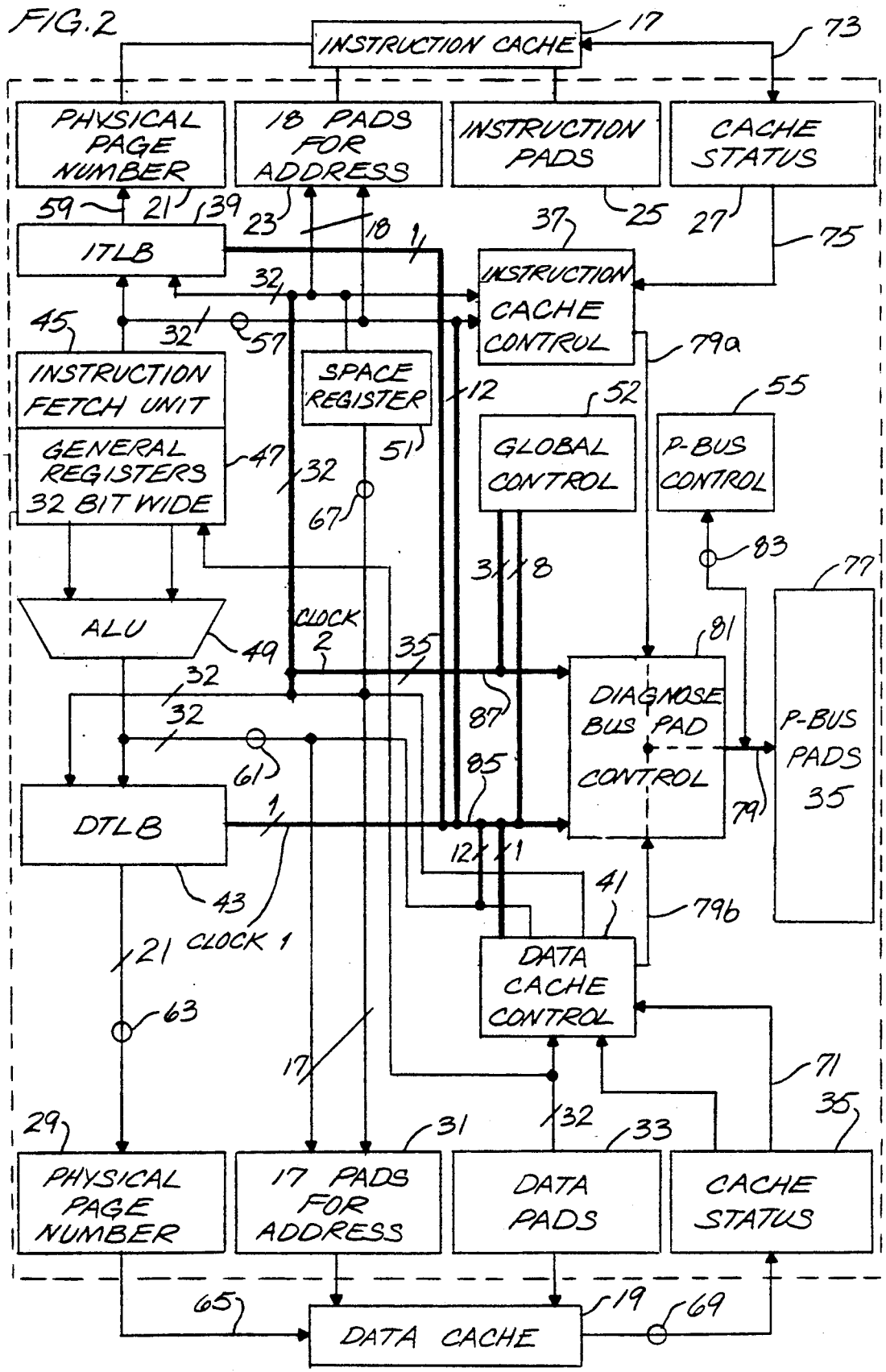

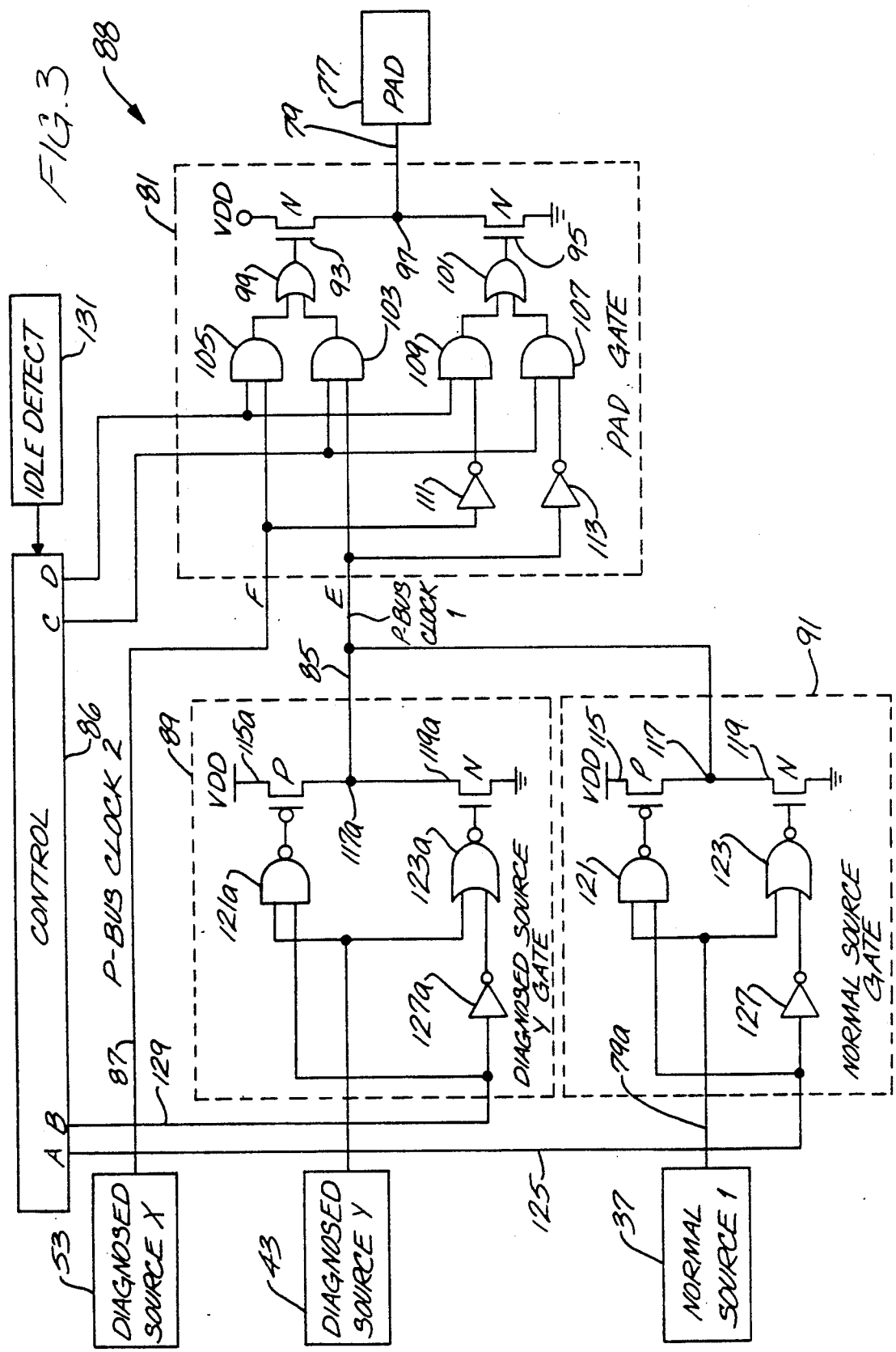

DIAGNOSTIC SYSTEM FOR INTEGRATED CIRCUITS USING EXISTING PADS

BACKGROUND OF THE INVENTION

The present invention is directed to an integrated circuit (IC) and, in particular, to monitoring signals inside the IC so as to diagnose various conditions which might be occurring. IC's are extremely dense with circuitry, and contact pads through which one might access such circuitry are at great premium. As an example, an IC with which the present invention has been used measures 1.4 cm square and has over 300 connecting pads on its edges. These contact pads are dedicated to various circuit points inside the IC. It has been found to be of great advantage to be able to access, through existing contact pads, circuit points in the IC not heretofore monitored for lack of access through available contact pads.

SUMMARY OF THE INVENTION

In accordance with the present invention, an IC is provided with a time-sharing diagnostic system utilizing an existing set of contact pads whose conventional function is to individually carry signals between a first set of internal circuit points and a corresponding set of circuit points external to the IC. Connecting means are provided for alternatively connecting each of the contact pads to a corresponding one of the first set of circuit points and a corresponding one of an additional second set of internal circuit points whose condition it is desired to monitor. Each contact pad is shared between a circuit point of the first set and a circuit point of the second set, under the guidance of control means connected to the connecting means, so as to selectively connect either one of the first or one of the second set of internal circuit points to a corresponding one of the contact pads. Typically, the first set of contact points may be associated with one or two functional elements of the IC, whereas members of the second set of contact points are typically distributed among functional elements throughout the IC, thereby allowing diagnosis of conditions throughout the IC.

Advantageously, the first set of circuit points, which are normally accessed on the IC through their associated contact pads, may send or receive signals through its associated contact pad relatively seldom. Such is the case, for example, where the IC contains a central processing unit (CPU) and wherein the dedicated contact pads in question serve as a conduit to carry signals between a data cache control unit and an instruction cache control unit on the IC and a memory external to the chip. Where the above situation prevails, the dedicated contact pads are relatively seldom used by the circuit points to which they are normally dedicated. Consequently, the idle times of the dedicated pads, during which they are not required to carry signals to or from their associated circuit points on the IC, can be detected and signalled to means for alternatively connecting to such contact pads either the dedicated circuit points to which they would normally be connected or, in the alternative, other circuit points on the IC which it is desired to monitor, without imposing additional contact pads on the IC.

In accordance with a further feature of the present invention, a dedicated pad may be shared by a normal circuit point, during regular operation of the IC, and during idle times, when signals are neither sent nor received by such points, the pad may be shared among more than one additional circuit points, thereby multiplying the number of such additional circuit points that can be accommodated by a given number of dedicated contact pads.

BRIEF DESCRIPTION OF THE DRAWINGS

FIG. 2 is a block-diagrammatic representation of the IC of FIG. 1, including, generally, the time-sharing diagnostic system of the invention;

FIG. 3 is a block diagram of the diagnostic system of the present invention associated with a single contact pad of the IC, a single source with which that pad is normally associated, and a pair of diagnosed sources which may be alternately connected to the pad when it is not connected to its associated normal source;

DETAILED DESCRIPTION

Figure 1:
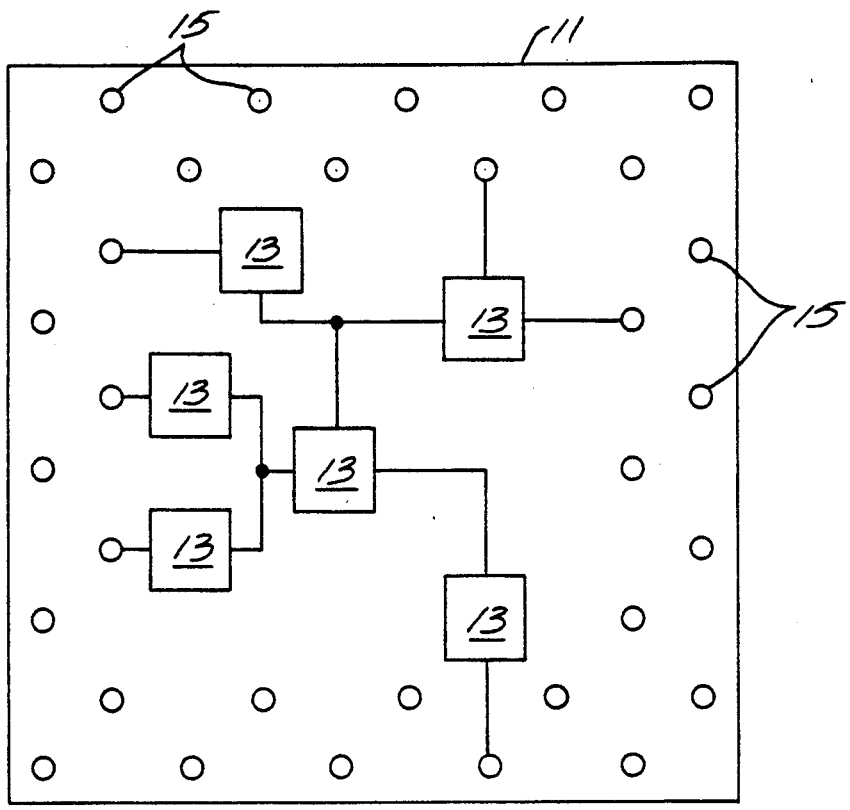
FIG. 1 is a schematic plan view of an IC of the type with which the present invention may be used.

An exemplary Integrated Circuit (IC) 11 is illustrated in FIG. 1. The IC 11, with which the present invention has been used, embodies the CPU of a computer and is about one-half the size of a postage stamp, 1.4 cm square. The IC embodies a number of Interconnected Functional Elements 13, which communicate with elements outside the IC through a set of Contact Pads 15, of which there are several hundred distributed around the periphery of the IC. It is such an IC that is disclosed in somewhat greater detail in FIG. 2, so that the usefulness of the present invention, in monitoring the status of various elements of such an IC, may be better appreciated. In general, only those portions of the IC 11 that are associated with a pair of external cache memories 17 and 19 are shown. The Instruction Cache 17 and the Data Cache 19 are relatively small, rapid-access memories which, in the illustrated example, communicate with the IC 11 to send and receive data which is frequently used by the IC and which, for that reason, is stored in the cache memories.

Communication between the Instruction Cache 17 and functional elements of the IC 11 is through selected ones of the Contact Pads 15, which are allocated according to function for that purpose and are divided into four subgroups. These are identified, near the top edge of the IC 11, as the Physical Page Number 21, 18 Pads for Address 23, Instruction Pads 25, and Cache Status 27. A similar set of four contact pad groups are dedicated for communicating with the Data Cache 19 and are shown along the bottom edge of the IC 11. They are Physical Page Number 29, 17 Pads for Address 31, Data Pads 33, and Cache Status 35.

Working with the Instruction Cache 17 in the IC 11 are an Instruction Cache Control 37, connected to the Instruction Cache 17 through the Cache Status Pads 27, and an Instruction Translation Lookaside Buffer (ITLB) 39, connected to the Instruction Cache through the Physical Page Number Pads 21. Similarly, associated with the Data Cache 19 are a Data Cache Control 41, connected to the Data Cache 19 through the Cache Status Pads 35, and a Data Translation Lookaside Buffer (DTLB) 43, connected to the Data Cache 19 through the Physical Page Number Pads 29. The remaining functional blocks illustrated for the IC 11 interact with both of the cache units 17 and 19. They include an Instruction Fetch Unit 45, General RegisterS 47, an Arithmetic Logic Unit (ALU) 49, Space Register 51, Global Control 52, and P-Bus Control 55. Data travels among the above blocks and between them and the various contact pads over lines, each of which contains a number of conductors, indicated by a number next to a short, diagonal stroke across the particular line. Each line, therefore, carries a number of bits corresponding to the number next to the diagonal stroke crossing that line.

The Instruction Fetch Unit 11 generates a 32-bit Virtual Address, which is sent over the 32-bit Line 57 to the ITLB 39, which translates the Virtual Address to a Physical Page Number and sends it over the 21-bit Line 59 to the Physical Page Number Pads 21, and thence over the 21-bit Line 61 to the Instruction Cache 17. The Virtual Address is also sent by the Instruction Fetch Unit 11 over the Line 57 to the 18 Pads for Address 23 and to the Instruction Cache Control 37.

Another 32-bit Virtual Address is supplied to the ITLB 39, the 18 Pads for Address 23, and the Instruction Cache 37 by the Space Register 51. Thus, between them, the Instruction Fetch Unit 11 and the Space Register 51 provide 64 bits of Virtual Address.

The General Registers 47 contain operands which, during operation, are fed to the ALU 49. The output of ALU 49 is fed over the 32-bit Line 61 to the DTLB 43 and the Data Cache Control 41. In the DTLB 43, the 32 bits of Virtual Address from the ALU 49 are translated to Physical Page Numbers supplied over the 21-bit Line 63 to the Physical Page Number Pads 29, and thence over the 21 Bit Line 65 to the Data Cache 19. An additional 32 bits of Virtual Address are provided by the Space Register 51 over 32-bit Line 67 to the DTLB 43, the 17 Pads for Address 31, and the Data Cache Control 41. Accordingly, the General Registers, 32 bits wide, 47 and the Space Register 51, provide a total of 64 bits of Virtual Address to the Data Cache 19. Seventeen bits are sent over each of two extensions of the lines 61 and 67 from the ALU 49 and the Space Register 51 to the 17 Pads for Address 31 for use by the Data Cache 19.

The function of the Global Control 52 is to provide control signals to a majority of the functional elements of the IC 11. Its numerous connections would only obscure this description and have, for that reason, been omitted.

Occasionally, an address sent to one of the cache units 17 and 19 does not exist or, if it does exist, the requested data is missing. Either of these conditions is called a "cache miss." A cache miss in the Data Cache 19 is signalled to the Data Cache Control 41 through Cache Status Pads 35, which are connected to the Data Cache over Line 69 and to the Data Cache Control over Line 71. Similarly, a cache miss in the Instruction Cache 17 is signalled to the Instruction Cache Control 37 through Cache Status Pads 27, connected to the Instruction Cache 17 by Lines 73, and to the Instruction Cache Control 37, by Lines 75.

Detection of a cache miss by either of the Cache Control Units 37 and 41 signals the need to acquire from an alternative source the data which would have been obtained from one of the cache units 17 and 19. That source (not shown) is a memory substantially larger than either of the cache memories 17 and 19, located outside of the IC 11. The offsite memory's ports communicate with elements of the IC 11 through a bus (not shown) whose conductors are individually connected to respective ones of the P-Bus Pads 77. Respective ones of the P-Bus Pads 77 are individually connected to conductors of the P-Bus 79, which, in turn, branches out to both of the Cache Control Units 37 and 41.

In the exemplary embodiment, 35 individual conductors comprise the P-Bus 79. In FIG. 2, portions of P-Bus 79 are shown in dashed lines inside a Diagnose Logic Block 81. Inside that Diagnose Logic Block 81 are components which comprise some of the elements of the diagnostic system of the present invention. The dashed portion of the P-Bus 79 inside the Diagnose Logic Block 81 reflects the fact that, in the exemplary IC 11, without the use of the present invention, the P-Bus 79 would be connected directly to the Cache Control Units 37 and 41. In implementing the present invention in the exemplary IC 11, the Diagnose Logic Block 81 is interposed between the P-Bus 79 and certain elements of the IC 11, including the Cache Control Units 37 and 41.

When either of the Cache Control Units 37 and 41 detects a cache miss, it requests data from the offsite memory to be sent through the P-Bus Pads 77 and over the 35-line P-Bus 79. Control of this operation is under P-Bus Control Block 55. Cache misses occur relatively seldom, so that the P-Bus Pads 77 and the P-Bus 79 are relatively seldom used. As a result, there are frequent periods during which both the P-Bus 79 and the P-Bus Pads 77 are idle. In accordance with the present invention, use is made of the P-Bus 79 and its associated pads 77 to carry information about the operation of various functional elements in the IC 11. In keeping with a first principal aspect of the present invention, the P-Bus 79 is shared between the Cache Control Units 37 and 41, on the one hand, and the input/output ports of several other functional elements which it is desired to monitor, on the other hand. In keeping with this aspect of the invention, there is added to the IC 11 a P-Bus clock 1 Line 85, which is connected through a set of logic gates (shown in FIG. 3, but not in FIG. 2) to various ones of the functional elements to be monitored, on the one hand, and through the Diagnose Logic 81 to the P-Bus 79, on the other hand. By means of the logic circuits at opposite ends of the P-Bus clock 1 Line 85, the P-Bus 79 and its associated Pads 77 can be made accessible to carry signals, on demand, between the offsite memory and the Cache Control Units 37 and 41 and can be made accessible to the P-Bus clock 1 Line 85 to carry signals from the various monitored functional elements during the remaining, idle times of the P-Bus 79.

In accordance with a second particular aspect of the present invention, an additional, P-Bus clock 2 Line 87 is provided for monitoring a second set of additional circuit points, the Line 87 being connected between various other functional elements of the IC 11 through logic gates (also shown in FIG. 3, but not in FIG. 2) and the P-Bus 79 through Diagnose Logic Block 81, so that, during the idle times of the P-Bus 79, it may be shared to carry information on P-Bus clock 1 Line 85 and P-Bus clock 2 Line 87.

In the exemplary embodiment of FIG. 2, P-Bus clock 1 Line 85 is connected to carry one bit from DTLB 43, one bit from ITLB 39, 12 bits from Instruction Cache Control 37, 12 bits from Data Cache Control 41, eight bits from Global Control 52, and one bit from a second port of Data Cache Control 41, for a total of 35 bits. Similarly, the P-Bus clock 2 Line 87 carries 32 bits from the Space Register Line 67, and an additional three bits from Global Control 52, for a total of 35 bits. Accordingly, between them, the two added P-Bus clock Lines 1 and 2 are capable of accessing 70 bits in the IC 11.

In the claims, the circuit points accessed by the P-Bus clock 1 and P-Bus clock 2 Lines 85 and 87 will be occasionally collectively designated as a "second set of contact points." The contact points monitored over the P-Bus clock Lines 85 will be specifically referred to as the "First Subset," and the contact points monitored by the P-Bus clock 2 Line 87 will be specifically referred to as the "Second Subset" of such "Second Set."

Both of the above-recited aspects of the present invention are illustrated in FIG. 3 with reference to a single, shared P-Bus Pad 77. The primary function of the FIG. 3 circuit is to alternatively connect the Pad 77 to each of two contact points in the IC, one of which is normally connected to the Pad 77, and the other one of which is connected thereto as the result of the present invention. As shown in FIG. 3, the normally connected point has been selected to be one of the outputs of the Instruction Cache Control 37, is labelled "Normal Source," and, again, is numbered "37." The other circuit point, which is accessed as the result of the present invention, has been selected to be an output of the DTLB 43, carried on the P-Bus clock 1 Line 85. This output is labelled in FIG. 3 as "Diagnosed Source Y" and bears the numeral "43." A secondary function of the FIG. 3 circuit is to alternately connect another source, the Diagnosed Source X 53, in addition to the Diagnosed Source Y 43, when the Normal Source 37 is not being connected to the Pad 77. The output of Diagnosed Source 53 is applied over P-Bus clock 2 Line 87 directly to the "F" input of Diagnose Logic Block 81.

The output of Normal Source 37 is applied to the "E" input of Diagnose Logic Block 81 through a Normal Source Gate 91. The function of Gate 81 is to selectively allocate the P-Bus 79 between the input E, which may receive the output of Normal Source 37 or, alternatively, to the input F, which always receives the output of Diagnosed Source X 53. As will be shown shortly, the input E to Gate 81 is shared between the Normal Source 37 and the Diagnosed Source Y 43.

The Diagnose Logic Block 81 comprises a pair of NMOS transistors 93 and 95, connected in series between a voltage source $V_{DD}$ and ground and having a Junction Point 97 connected to the Pad 77. The Transistors 93 and 95 are respectively driven by OR Gates 99 and 101. The OR Gate 99 receives the outputs of a pair of AND Gates 103 and 105, respectively having as one of their inputs the logic levels on lines C and D of the Control Unit 86. Similarly, the OR Gate 101 receives the outputs of AND Gates 107 and 109, which respectively receive as one of their inputs the logic levels on lines C and D of the Control Unit 86. The second inputs to the AND Gates 105 and 109 are, respectively, the logic level on the Line 87 and applied to input F of the circuit, and the inverse thereof produced by an Inverter 111. Similarly, the second inputs to the AND Gates 103 and 107 are the logic level on the Line 85, applied to the input E of the Gate 81, and its inverse, produced by an Inverter 113.

The Line 85 is connected to the outputs of Gates 89 and 91, which may be identical and whose elements will be identified by the same reference numerals, but with an "a" added when referring to the elements of the Gate 89. Referring to the Gate 91, its output stage is comprised of a PMOS Transistor 115, connected between the voltage source $V_{DD}$ and a Node 117, and an NMOS Transistor 119, connected between the Node 117 and ground. The Node 117 is the output point of the Circuit 91 and is connected to the input E of the Gate 81. The output of the Normal Source 37 is applied on the Line 79A to one input each of a NAND Gate 121 and a NOR Gate 123, whose outputs are connected to the gates of the P and N Transistors 115 and 119, respectively. The second input to the NAND Gate 121 is a control signal on the output A of the Control 86 received over Line 125, and the second input to the NOR Gate 123 is the inverse of the control signal A, derived from the Line 125 by an Invertor 127.

Referring to the Diagnosed Source Y Gate 89, its output is propagated from its associated source, the Diagnosed Source Y 43, in the same manner in which the output of the Gate 91 performs its function. The only difference is that the Gates 121a and 127a receive as their inputs a logic level on the output B of the Control 86 over Line 129. The logic levels on the outputs A and B are respectively determinative of when the Gates 89 and 91 are enabled to transmit the signals on the outputs of their respective sources 43 and 37.

Under normal operation of the IC 11 (that is, when the logic level on the Normal Source 37 is to be applied to the Pad 77), the logic level on control outputs A and C are high, or enabling, and those on outputs B and D are low, or disabling. As a result of C being high and D being low, the AND Gates 103 and 107 of the Gate 81 are enabled to transmit their respective outputs through the OR Gates 99 and 101 to the Output Transistors 93 and 95. With logic level on A high, or enabling, and B low, or disabling, the Normal Source 1 Gate 91 is enabled, and the Diagnosed Source Y Gate 89 is disabled. Consequently, the output of the Normal Source 37 is gated through Gate 91 to the E input of Gate 81 and through Gates 103 and 99 of Gate 81, to turn NMOS 93 on, and NMOS 95 off, pulling the Node 97 high. Thus, the output of Normal Source 37 is gated through Gate 81 to the Pad 77.

In the diagnostic mode of the circuit (that is, when the logic level on the Diagnosed Source X 53 is to be applied to the Pad 77), the control output logic level B is high, or enabling, and that of A is low, or disabling.

In addition to the foregoing states of outputs A and B, the outputs C and D should also be high, and low, respectively, as in the previous case, if Diagnosed Source Y 43 is to be accessed. This insures that, in the diagnostic mode, the Diagnosed Source Y 43 is accessed through the Gate 81 in the same fashion as is the Normal Source 37 in the normal mode. As a result of these logic levels on the outputs A and B of the Control 86, the Gate 91 is disabled, and the Gate 89 associated with the Diagnosed Source Y 43 is enabled. This state is preferably initiated in the Control 86 in response to an Idle Detect Circuit 131, which detects when signals are not being sent or need not be sent over the Contact Pad 77 between the Normal Source 37 and the offsite memory. This information is available from the Cache Control Units 37 and 41, to which the Idle Detect Circuit 131 may be connected for that purpose. Consequently, whenever the idle detect circuit of the Control 86 detects that the Pad 77 is not needed to communicate data between the offsite memory and the Normal Source 37, it switches the state of the signals on outputs A and B from "normal" to "diagnostic," in which A is low, so as to disable the Gate 91, and B is high, so as to enable the Gate 89.

With the system in the diagnostic mode, an optional, but highly desirable, feature of the invention may be put into effect. In accordance with this feature of the invention, the number of diagnosed sources which can be monitored through a single pad may be doubled (in the disclosed version), or even multiplied several times, if desired. In implementing this feature of the invention, while the system is in its diagnostic mode with the Control 86 outputs A and B low and high, respectively, the voltage levels on outputs C and D of the Control 86 are alternated (clocked) in a complementary fashion so that, during each clock cycle, each of the outputs C and D is enabling half of the time, and so that, whenever the voltage level on one of the outputs C and D is enabling, the voltage level on the other of the outputs C and D is disabling. Accordingly, during each clock cycle, both of the Diagnosed Sources 43 and 53 have their outputs passed through the Gate 81 to the Pad 77, each to the exclusion of the other. That is, when C is high and D is low, Diagnosed Source Y 43 is monitored, as described above. Conversely, when C is low and D is high, Diagnosed Source X 53 is accessed by the Pad 77 through Gate 81. While Diagnosed Source X 53 is so accessed, Normal Source 37 is cut off from the Pad 77, because A is low, disabling Gate 91, and Diagnosed Source Y 43 is similarly cut off because D is low, disabling Gate 103. It is apparent that, if it were desired to monitor more than two diagnosed sources through the Pad 77, additional clock lines and gates could be added for that purpose.

An alternative way of viewing the operation of the system, and a more typical way of operating it, is to consider the outputs on C and D of the Control 86 as normally alternating in a complementary fashion, as described, so as to generate two Complementary clocks 1 and 2. The clocks operate in both the normal and diagnostic modes of the system. In the normal mode, with the Control Circuit 86 output A high, the output from the Normal Source 37 is gated to the Pad 77 by the Gate 81 during positive halves of the clock 1 cycle, and not gated through at all during negative halves of that cycle. In the diagnostic mode of the system, the Diagnosed Source Y 43 is gated through during the positive halves of clock 1, and Diagnosed Source X 53 is gated through during positive halves of clock 2. Thus, the logic states on outputs C and D need not be thought of as static states, but may be considered, and indeed preferred, to be continually alternating, both in the normal mode and in the diagnostic mode.

Figure 5:
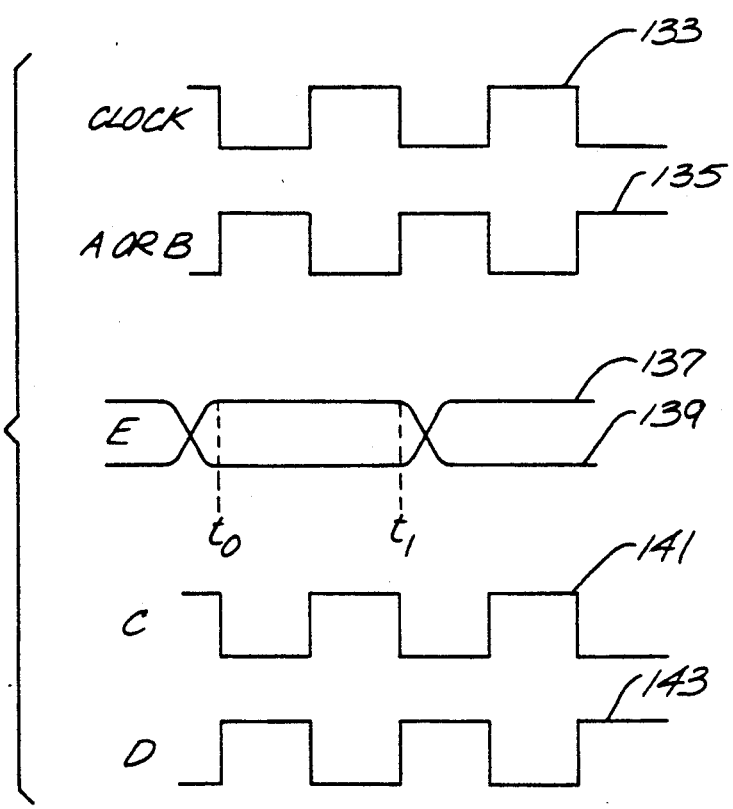
FIG. 5 is a set of waveforms for the FIG. 3 system.

FIG. 5 illustrates the waveforms which would apply to the system of FIG. 3 if operated in the mode outlined in the preceding paragraph. An alternating waveform 135, derived from a system clock 133, would be put on either the A or the B output of Control 86, depending upon which of the Gates 89 and 91 is to transmit a signal from its associated Source 43 and 37. In response to the waveform 135 on the appropriate one of the A and B lines, a signal is put on the P-Bus clock 1 Line 85, to the E input of gate 81. The signal transition occurs at time $t_0$, when the signal goes either from high to low or from low to high, depending upon its state at time $t_0$, and maintains its state for a full clock cycle until the time $t_1$. A negative transition is illustrated by the waveform 137, and excursion of the opposite sense is illustrated by the waveform 139. A second set of waveforms 141 and 143, which respectively coincide with the clock 133 and the A or B waveform 135, may both be derived from the clock 133 and are respectively put on the C and D outputs of the Control 86. Thus, it may be seen that the signal at input E may be transmitted through the Gate 81 during one half of a cycle of the clock 133, while, during the other half of the clock's cycle, a signal from the Diagnosed Source X 53, appearing at point F, may be transmitted through the Gate 81.

Figure 4:
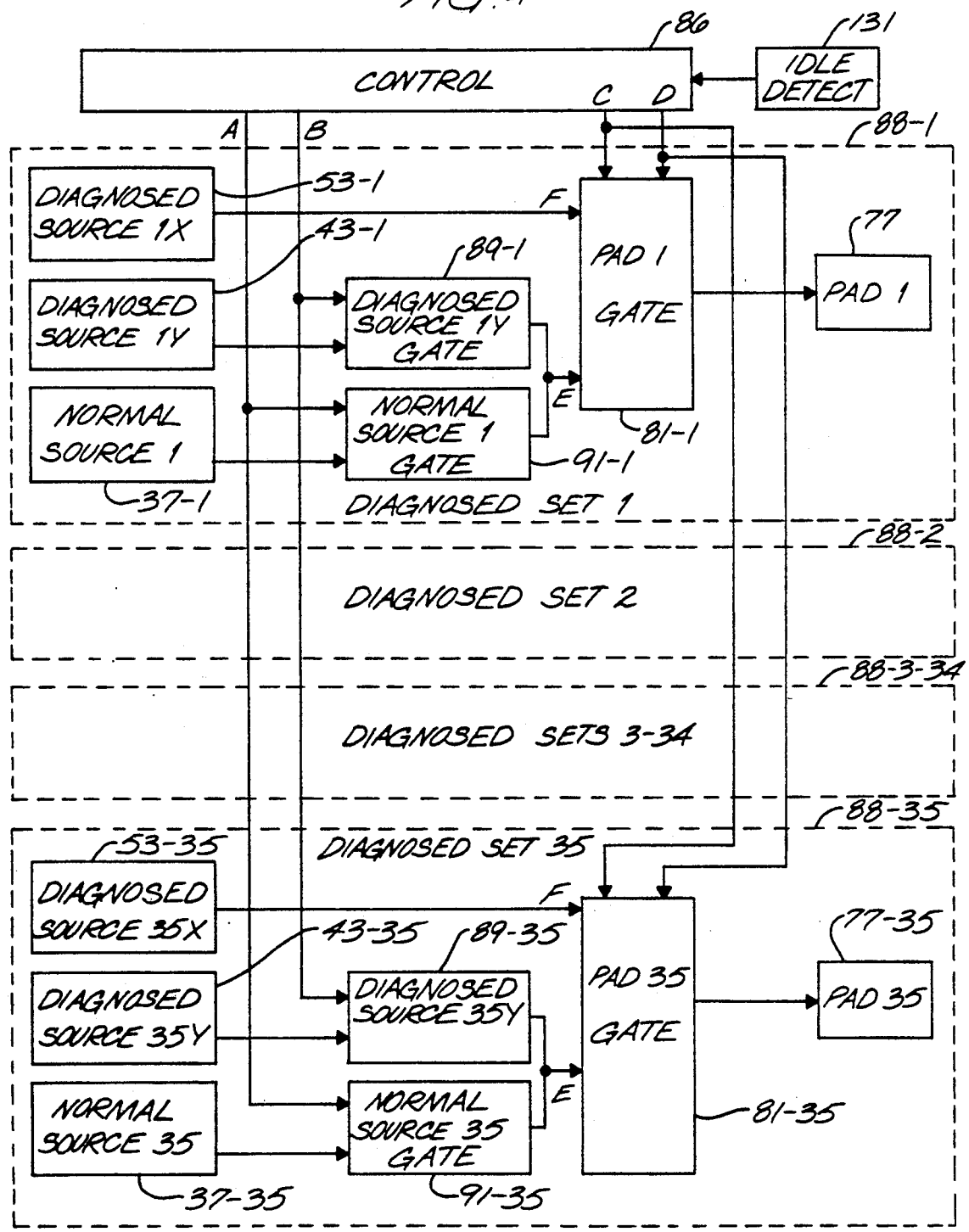
FIG. 4 is a block diagram of a plurality of circuits, one of which is depicted in FIG. 3, to show the overall arrangement of the time-sharing diagnostic system of the invention, in which 35 contact pads are alternately enabled to receive the signals on 70 diagnosed sources during alternate periods of time when the pads are not connected to receive the signals from their associated normal sources.

The foregoing description of the diagnostic system has been with reference to a single Channel 88, involving a single Pad 77, a single Normal Source 37 normally associated therewith, and a single pair of Diagnosed Sources X and Y 43 and 53, which may be alternately monitored through the Pad 77 when it is not receiving the output of the Normal Source 37. In FIG. 4, there is shown a 35-channel system, each of whose channels is comprised of one of the Channels 88 illustrated in FIG. 3. All of the 35 Channels 88-1 through 88-35 of the FIG. 4 system share a single Control 86, so that all of the Pads 77-1 through 77-35 are gated in unison to their respective Normal Sources 37-1 through 37-35 or, in the alternative, to alternate ones of their respective pair of Diagnosed Sources X and Y. In other words, when the output A of the Control 86 is high (normal mode), all 35 of the Normal Sources 37-1 through 37-35 are gated through to the Pad 77-1 through 77-35, and, conversely, when the output B of the Control 86 is high (diagnose mode), all of the Diagnosed Sources X 53-1 through 53-35 are switched through in unison to the Pads 77-1 through 77-35 when the clock on control output D is high and all of the Diagnosed Sources Y 43-1 through 43-35 are gated through to the Pads when the clock on control output C is high.

While, in the foregoing description, a computer chip has been used to illustrate the usefulness of the invention, it is apparent that any complex IC could benefit from the invention. What has been described is a way of extending the utility of a set of contact pads which heretofore had been limited to carrying information between a relatively small number of functional elements on an IC and elements outside the circuit. By virtue of the invention, the utility of such dedicated contact pads has been significantly expanded so that, without the addition of any contact pads to the already-crowded periphery of the IC, a substantial number of circuit points within the IC can be monitored through those same contact pads and, therefore, without providing any invasive means, such as probes, that might be otherwise necessary. Consequently, many points which could not heretofore be readily monitored, and many abnormal conditions which could not heretofore be readily diagnosed, can now be readily and conveniently detected.

What is claimed is:

1. In an integrated circuit (IC) having first and second sets of plural internal circuit points and a set of contact pads corresponding to said first and second set of circuit points for individually carrying signals intermittently between respective ones of said first set of circular points and a corresponding set of circuit points external to said IC, a time-sharing diagnostic system comprising, in combination with said IC:

a) connecting means for alternatively connecting each of said pads to a corresponding point of said first and second sets of internal circuit points;
   b) means for detecting and signalling the presence or absence of signals carried over said set of contact pads between said first set of circuit points and said external circuit points; and c) control means for controlling said connecting means so as to connect said first set of internal circuit points to said set of contact pads during a first series of operating periods and to connect said second set of internal circuit points to said set of contact pads during a second series of operating periods during which said detecting and signalling means detects an absence of signals being carried between said first set of circuit points and said external circuit points over said set of contact pads.

2. The diagnostic system of claim 1, wherein said first set of internal circuit points comprises the input/output ports of a first group of functional elements internal to the IC, and said second set of internal circuit points is distributed among the input/output ports of several additional functional elements internal to and distributed throughout said IC, so as to enable monitoring of said distributed elements.

3. The diagnostic system of claim 2, wherein said IC includes a data cache control in communication with a data cache memory outside the IC, and wherein said first group of functional elements includes said data cache control.

4. The diagnostic system of claim 3 wherein said data cache control signals said control means to inform said connecting means as to whether or not the set of contact pads is required for communication between said data cache control and said circuit points external to said IC.

5. The combination of claim 1, wherein:

a) said second set of circuit points comprises first and second subsets, each subset including a plurality of circuit points;

b) said connecting means includes means for alternatively connecting said set of circuit pads to circuit points of said first and second subsets; and c) said control means includes means coupled to said connecting means to command it to alternately connect said set of contact pads to contacts of said first and second subsets respectively.

6. The combination of claim 5, wherein:

said set of contact pads intermittently carries signals between said first set of circuit points and said external circuit points;

b) there is additionally provided idle-detect means for signaling said control means of idle pad periods, during which signals are not being sent on said contact pads between said first set of contact points and said external circuit points; and c) said control means is operative to command said connecting means in response to a signal from said idle-detect means to disconnect said first set of circuit points from said set of contact pads during said idle periods and to connect thereto said second set of circuit points instead.

7. In an integrated circuit (IC) having a contact pad, a circuit point internal of said IC and normally accessed during intermittent periods of said IC operation for communicating a normal signal between said circuit point and an external circuit point outside of said IC through said contact pad, and also having first and second alternative circuit points internal of said IC, through which selected conditions within said IC are to be diagnosed, a time-sharing diagnostic system comprising, in combination with the foregoing, logic circuit means responsive to the presence or absence of a normal signal to be communicated through said contact pad for:

a) connecting said contact pad to said internal circuit point during said intermittent periods; and, b) during intervals between successive ones of said intermittent periods, disconnecting said contact pad from said internal circuit point and alternately connecting said contact pad to said first and second alternative circuit points.

8. The combination of claim 7, wherein said logic circuit includes:

a) first gating means for connecting said normally accessed circuit point to an internal node during said intermittent periods and for connecting said first alternative circuit point to said internal node during said intervals between said intermittent periods; and b) second logic means for alternately connecting said node and said second alternative circuit point to said contact pad during said intervals between said periods, whereby, during said intermittent periods, said contact pad is connected to said normally accessed circuit point and, during said intervals, said contact pad is alternately connected to said first and second alternative circuit points.

9. In an integrated circuit (IC) having a set of contact pads, a set of circuit points internal of said IC and normally accessed during intermittent periods of said IC operation for communication of a normal signal between respective ones of said circuit points and corresponding ones of a set of circuit points outside of said IC through respective ones of said set of contact pads, said IC also having first and second sets of alternative circuit points internal of said IC through which selected conditions within said IC are to be diagnosed, a time-sharing diagnostic system comprising, in combination with the foregoing, a logic circuit associated with each of said set of contact pads and responsive to the presence or absence of a normal signal to be communicated through its associated contact pad for:

a) connecting its associated contact pad to a respective one of said set of internal circuit points during said intermittent periods; and, b) during intervals between successive ones of said intermittent periods, disconnecting said contact pad from its associated internal circuit point and alternately connecting said contact pad to respective ones of said first and second sets of alternative circuit points.

10. The diagnostic system of claim 9, wherein said logic circuits each include:

a) a first gating means for connecting one of said normally accessed circuit points to a given one of a plurality of internal nodes during said intermittent periods and for connecting said first alternative circuit point to said given one of said internal nodes during said intervals between said intermittent periods; and b) second logic means for alternately connecting said node and said second alternative circuit point to said contact pad during said intervals between said periods, whereby, during said intermittent periods, said contact pads are connected to said set of normally accessed circuit points and, during said intervals, said contact pads are alternately connected to respective ones of said first and second sets of alternative circuit points.

* * * * *